United States Patent
Laptev et al.

(10) Patent No.: US 8,808,513 B2
(45) Date of Patent: Aug. 19, 2014

(54) STRESS ADJUSTMENT IN REACTIVE SPUTTERING

(75) Inventors: Pavel N Laptev, Ventura, CA (US); Valery Felmetsger, Goleta, CA (US)

(73) Assignee: OEM Group, Inc, Gilbert, AZ (US)

( * ) Notice: Subject to any disclaimer, the term of this patent is extended or adjusted under 35 U.S.C. 154(b) by 519 days.

(21) Appl. No.: 12/411,301

(22) Filed: Mar. 25, 2009

(65) Prior Publication Data

US 2009/0242392 A1  Oct. 1, 2009

Related U.S. Application Data

(60) Provisional application No. 61/039,348, filed on Mar. 25, 2008.

(51) Int. Cl.
 *C23C 14/00* (2006.01)
 *C25B 11/00* (2006.01)
 *C25B 13/00* (2006.01)

(52) U.S. Cl.
 USPC .................................................. 204/298.08

(58) Field of Classification Search
 USPC .................................................. 204/298.08
 See application file for complete search history.

(56) References Cited

U.S. PATENT DOCUMENTS

| | | | |
|---|---|---|---|
| 3,650,940 A * | 3/1972 | Bardahl | 204/224 M |
| 3,856,647 A | 12/1974 | Blachman | |
| 3,879,278 A | 4/1975 | Grosewald et al. | |
| 4,007,063 A | 2/1977 | Yasuda et al. | |
| 4,010,312 A | 3/1977 | Pinch et al. | |
| 4,298,804 A | 11/1981 | Colditz | |
| 4,404,077 A | 9/1983 | Fournier | |
| 4,427,524 A | 1/1984 | Crombeen et al. | |
| 4,486,287 A | 12/1984 | Fournier | |
| 4,547,279 A | 10/1985 | Kiyota et al. | |
| 4,572,776 A | 2/1986 | Aichert et al. | |
| 4,595,482 A | 6/1986 | Mintz | |

(Continued)

FOREIGN PATENT DOCUMENTS

| | | |
|---|---|---|
| DE | 4127262 C1 | 6/1992 |
| EP | 0010971 | 5/1980 |

(Continued)

OTHER PUBLICATIONS

K. F. Chiu, Z. H. Barber, and R. E. Somekh, Thin Solid Films, 39-42, 343 (1999).

(Continued)

*Primary Examiner* — Roy King
*Assistant Examiner* — Jenny Wu
(74) *Attorney, Agent, or Firm* — Polsinelli PC

(57) ABSTRACT

In a dual cathode magnetron, an adjustment circuit is provided between a pair of sputter targets having a coaxial (preferably frusto-conical) relationship to modify the distribution of ion and electron currents flowing from the plasma discharge to a substrate residing within a sputter chamber. A stress adjustment circuit is used to modify the ion bombardment of the growing films on the substrate resulting in a mechanism for control of the stress in the deposited films. In a preferred embodiment, the adjustment circuit comprises a variable resistor disposed between an internal shield that acts as a passive anode and a target. The value of the variable resistor influences the plasma discharge current distribution between the split sputter targets and the internal shields, and can effectively be used to adjust the properties of the deposited films.

14 Claims, 6 Drawing Sheets

(56) References Cited

U.S. PATENT DOCUMENTS

| | | | |
|---|---|---|---|
| 4,619,865 A | 10/1986 | Keem et al. | |
| 4,661,228 A | 4/1987 | Mintz | |
| 4,923,584 A | 5/1990 | Bramhall, Jr. et al. | |
| 4,946,546 A | 8/1990 | Bourgeois-Moine | |
| 4,946,576 A | 8/1990 | Dietrich et al. | |
| 5,096,536 A | 3/1992 | Cathey | |
| 5,133,850 A | 7/1992 | Kukla et al. | |
| 5,174,880 A | 12/1992 | Bourez et al. | |
| 5,266,178 A | 11/1993 | Sichmann | |
| 5,345,534 A | 9/1994 | Najm et al. | |
| 5,415,757 A * | 5/1995 | Szcyrbowski et al. | 204/298.08 |
| 5,507,930 A | 4/1996 | Yamashita et al. | |
| 5,558,749 A | 9/1996 | Yokoyama et al. | |
| 5,597,459 A | 1/1997 | Altshuler | |
| 5,658,828 A | 8/1997 | Lin et al. | |
| 5,869,877 A | 2/1999 | Patrick et al. | |
| 5,879,519 A | 3/1999 | Seeser et al. | |
| 5,882,399 A | 3/1999 | Ngan et al. | |
| 5,897,753 A | 4/1999 | Schatz et al. | |
| 5,925,225 A | 7/1999 | Ngan et al. | |
| 6,081,014 A | 6/2000 | Redford et al. | |
| 6,086,947 A | 7/2000 | Clarke | |
| 6,130,170 A | 10/2000 | David et al. | |
| 6,154,119 A | 11/2000 | Jankowski et al. | |
| 6,171,922 B1 | 1/2001 | Maghsoudnia | |
| 6,294,444 B1 | 9/2001 | Ueno | |
| 6,342,448 B1 | 1/2002 | Lin et al. | |
| 6,352,627 B2 * | 3/2002 | Leyendecker et al. | 204/298.08 |
| 6,361,667 B1 | 3/2002 | Kobayashi et al. | |
| 6,375,810 B2 | 4/2002 | Hong | |
| 6,399,411 B1 | 6/2002 | Hori et al. | |
| 6,420,863 B1 | 7/2002 | Milde et al. | |
| 6,482,681 B1 | 11/2002 | Francis et al. | |
| 6,488,823 B1 | 12/2002 | Chiang et al. | |
| 6,605,198 B1 | 8/2003 | Clarke et al. | |
| 6,720,261 B1 | 4/2004 | Anderson et al. | |
| 6,783,638 B2 | 8/2004 | Clarke | |
| 6,806,173 B1 | 10/2004 | Spitz et al. | |
| 6,824,653 B2 | 11/2004 | Oshmyansky et al. | |
| 6,863,987 B2 | 3/2005 | Kaneko et al. | |
| 7,179,350 B2 * | 2/2007 | Laptev et al. | 204/192.12 |
| 7,208,396 B2 | 4/2007 | Feletsger | |
| 7,964,085 B1 | 6/2011 | Wang et al. | |
| 2001/0008205 A1 | 7/2001 | Wilke et al. | |
| 2002/0075131 A1 | 6/2002 | Coates et al. | |
| 2002/0093101 A1 | 7/2002 | Iyer et al. | |
| 2003/0017628 A1 | 1/2003 | Li et al. | |
| 2003/0068898 A1 | 4/2003 | Lee et al. | |
| 2003/0109198 A1 | 6/2003 | Lee et al. | |
| 2003/0132524 A1 | 7/2003 | Felmetsget | |
| 2003/0205460 A1 * | 11/2003 | Buda | 204/192.13 |
| 2004/0063298 A1 | 4/2004 | Aga et al. | |
| 2004/0163952 A1 | 8/2004 | Oshmyansky et al. | |
| 2004/0168637 A1 | 9/2004 | Gorokhovsky | |
| 2004/0231972 A1 | 11/2004 | Laptev et al. | |
| 2004/0253828 A1 | 12/2004 | Ozawa et al. | |
| 2007/0046927 A1 | 3/2007 | Le et al. | |
| 2007/0080611 A1 | 4/2007 | Yamada et al. | |
| 2007/0235810 A1 | 10/2007 | Delgado et al. | |
| 2008/0083611 A1 | 4/2008 | Felmetsger | |
| 2009/0242388 A1 | 10/2009 | Laptev et al. | |
| 2009/0242392 A1 | 10/2009 | Laptev et al. | |
| 2009/0246385 A1 | 10/2009 | Felmetsger et al. | |

FOREIGN PATENT DOCUMENTS

| | | |
|---|---|---|
| EP | 0227438 | 1/1987 |
| EP | 0334564 A | 9/1989 |
| EP | 1046727 A | 10/2000 |
| EP | 1306896 A1 | 5/2003 |
| GB | 2106714 A | 4/1983 |
| JP | 63-317671 | 12/1988 |
| JP | 01-116068 | 5/1989 |
| JP | 02-225662 | 9/1990 |
| JP | 11-307479 | 11/1999 |
| JP | 2001-003166 | 1/2001 |
| JP | 2002033325 A | 1/2002 |
| RU | 2135634 | 8/1999 |
| WO | WO 01/29278 A | 4/2001 |
| WO | WO 0184619 A2 | 11/2001 |
| WO | WO 2004/107411 | 12/2004 |

OTHER PUBLICATIONS

G. Este and W. D. Westwood, J. Vac. Sci. Technol. A5, 1892 (1987).

G. Iriarte, F. Engelmark, M. Ottosson, and I. Katardjiev, J. Mater. Res. 18, 423 (2003).

Y. Oshmyansky, J. Larson, R. Ruby, and S. Mishin, Semicond. Int., Mar. 2003.

H. Windischmann, J. Vac. Sci. Technol. A9, 2431 (1991).

J. A. Thornton, J. Vac. Sci. Technol. A4, 3059 (1986).

H. Windischmann, Cult. Rev. Solid State Mater. Sci. 17, 547 (1992).

Felmetsger, "High-Adhesive Back Side Metallization of Ultrathin Wafers", May 2007, J. Vac. Sci. Technol. B 25(3), pp. 881-885.

Felmetsger, "Design, operation mode, and stress control capability of S-Gun magnetron for AC reactive sputtering." Surface & Coating Technology 204 (2009) 840-844.

Lundqvist N., et al, Effects fo substrate bias and temperature during titanium sputter-depostion on the phase formation in TiSi2. Microelectronics Engineering 60 (2002) 211-220.

Sricharoenchai P, et al, Effect of Substrate Temperature, Biasing and Sputter Cleaning on the Structure and Properties of Nanostructured TiB2 Coatings on High Speed Steel. Materials Transactions, vol. 51, No. 2 (2010), 246-252.

Final Office Action for U.S. Appl. No. 11/863,046 dated Apr. 22, 2013.

Final Office Action U.S. Appl. No. 12/411,357 dated Apr. 26, 2013.

Final Office Action U.S. Appl. No. 12/411,369 dated Jun. 13, 2013.

Non-Final Office Action U.S. Appl. No. 12/786,238 dated Jul. 24, 2012.

Dubois et al, "Stress and Piezoelectric Properties of Aluminum Nitride Thin Films Deposited onto Metal Electrodes by Pulsed Direct Current Reactive Sputtering", Journal of Applied Physics, vol. 89, No. 11, Jun. 2001, 6389-6395.

Ko et al., "Microstructure Analyses of the Titanium Films Formed by the Ionized Sputtering Process", Thin Solid Films 340, (1999), 13-17.

Alami et al., "Ion-Assisted Physical Vapor Deposition for Enhanced Film Properties on Nonflat Surfaces", J. Vac. Sci. Technol. A 23(2), Mar./Apr. 2005, 278-280.

Beach, "Design of Low-Temperature Thermal Chemical Vapor Deposition Processes", IBM J. REs. Develop., Nov. 1990, vol. 34, No. 6.

Blachman, "Stress and Resistivity Control in Sputtered Molybdenum Films and Comparison with Sputtered Gold", Metallurgical Transactions, 2, 1971, 699-709.

Felmetsger, "Stress Control in Multi-Layer Backside Metallization on Thinned Wafers", Oct. 1999, Sputtered Films, Inc., pp. 1-15.

Felmetsger, "Tailoring Sputtered Cr Films on Large Wafers", Jun. 1999, Sputtered Films, Inc., pp. 1-8.

Naik et al, "Low Temperature Deposition of Highly Textured AlN Film by Direct Current Magnetron Sputtering for Application in Thin Film Resonators", J. Electrochem. Soc., 146, 691-696, 1999.

International Preliminary Report on Patentability for international application No. PCT/US2007/080237, dated Apr. 7, 2009.

Non-Final Office Action for U.S. Appl. No. 11/863,046 dated Sep. 24, 2010.

Final Office Action for U.S. Appl. No. 11/863,046 dated Mar. 10, 2011.

Non-Final Office Action for U.S. Appl. No. 11/863,046 dated Nov. 4, 2011.

Final Office Action for U.S. Appl. No. 11/863,046 dated Apr. 6, 2012.

Non-Final Office Action for U.S. Appl. No. 11/863,046 dated Oct. 11, 2012.

Non-Final Office Action for U.S. Appl. No. 12/411,369 dated Nov. 4, 2011.

Final Office Action for U.S. Appl. No. 12/411,369 dated Mar. 14, 2012.

(56) References Cited

OTHER PUBLICATIONS

Non-Final Office Action for U.S. Appl. No. 12/411,369 dated Jul. 19, 2012.
Non-Final Office Action for U.S. Appl. No. 12/411,369 dated Feb. 27, 2013.
Non-Final Office Action for U.S. Appl. No. 12/411,357 dated Nov. 9, 2011.
Final Office Action for U.S. Appl. No. 12/411,357 dated Mar. 29, 2012.
Non-Final Office Action for U.S. Appl. No. 12/411,357 dated Oct. 4, 2012.
Non-Final Office Action for U.S. Appl. No. 09/949,181 dated Mar. 18, 2002.
Non-Final Office Action for U.S. Appl. No. 09/949,181 dated Jul. 24, 2002.
Final Office Action for U.S. Appl. No. 09/949,181 dated Nov. 15, 2002.
Non-Final Office Action for U.S. Appl. No. 09/949,181 dated Jan. 27, 2004.
Non-Final Office Action for U.S. Appl. No. 10/371,463 dated May 6, 2004.
Non-Final Office Action for U.S. Appl. No. 10/446,005 dated Apr. 21, 2006.
Non-Final Office Action for U.S. Appl. No. 10/051,886 dated Mar. 4, 2003.
Non-Final Office Action for U.S. Appl. No. 10/051,886 dated Oct. 20, 2003.
Final Office Action for U.S. Appl. No. 10/051,886 dated Apr. 20, 2004.
Non-Final Office Action for U.S. Appl. No. 10/051,886 dated Nov. 17, 2004.
Non-Final Office Action for U.S. Appl. No. 10/051,886 dated Aug. 23, 2005.
Final Office Action for U.S. Appl. No. 10/051,886 dated Jan. 24, 2006.
Non-Final Office Action for U.S. Appl. No. 10/051,886 dated Jun. 29, 2006.
Non-Final Office Action for U.S. Appl. No. 08/564,659 dated Apr. 9, 1997.
Final Office Action for U.S. Appl. No. 08/564,659 dated Aug. 7, 1998.
Examiner's Answer for U.S. Appl. No. 08/564,659 dated Feb. 16, 1999.

* cited by examiner

STRESS ADJUSTMENT IN REACTIVE SPUTTERING

This application claims priority from U.S. provisional patent application Ser. No. 61/039,348, filed on Mar. 25, 2008, entitled "Stress adjustment in reactive sputtering", which is incorporated herein by reference.

FIELD OF THE INVENTION

This invention relates to a system for, and method of, producing a deposition of material on a substrate. More particularly, the invention relates to stress control of thin films reactively sputtered in a sputter system with a split cathode ac powered magnetron.

BACKGROUND OF THE INVENTION

In recent years, remarkable progress has been achieved in developing new techniques for sputter deposition of oxide, nitride, and oxy-nitride thin films such as aluminum nitride, aluminum oxide, silicon nitride, silicon oxide, tantalum oxide, and tantalum oxynitride, among others. These films are being utilized in increasingly demanding ways that require increasing levels of control of the film properties. For example, piezoelectric aluminum nitride films used in various electroacoustic applications such as surface acoustic wave (SAW) and bulk acoustic wave (BAW) devices, thin film bulk acoustic resonators (FBAR) and microelectromechanical systems (MEMS) require dielectric films that are highly uniform, with low or no stress, and with a specific crystallographic orientation. Performance of these devices is substantially tied to the sputter technology that is used to deposit the aluminum nitride in terms of the film uniformity, texture, and stress. The ability to adjust the stress levels in thin films in sputter deposition equipment is advantageous for obtaining the necessary film properties for a wide range of devices for which the sputtering equipment can be used to fabricate.

Apparatus has been in use for some time for depositing sputtered atoms on a substrate to produce a layer of material defined by the sputtered atoms. The technique of sputtering material from a target to deposit on a substrate is commonly referred to as physical vapor deposition. Typical sputtering systems produce such a deposition by producing a glow discharge between an anode and a target, which acts as a cathode, to obtain an emission of sputtered atoms from the target. In most, if not all, sputtering equipment, a magnetic field is introduced in the vicinity of the sputter target to enhance the movement of electrons and subsequent ionization of the neutral gas and enable operation of the apparatus in the optimal sputter pressure regimes between 0.001 to 0.01 Torr within which sputtering yields from the target are optimal. An electric field applied in the vicinity of the target causes ions to bombard the surface of the sputter target. Electric fields can be applied using an alternating current power supply or a dc power supply. When, for example, an aluminum sputter target is bombarded with the ions of an inert gas such as argon, upon the application of the applied electric field, the target emits sputtered atoms of aluminum. The sputtered atoms travel to the substrate and become deposited on the substrate to produce a layer of the sputtered material. In systems in which an inert gas, or combination of inert gases, the method is commonly referred to as non-reactive physical vapor deposition. In non-reactive physical vapor deposition, the deposited layer is typically of the same stoichiometric composition as the target material.

An alternative to the non-reactive sputtering or non-reactive physical vapor deposition is reactive sputtering or reactive physical vapor deposition. In reactive sputtering, the deposited film is formed by plasma activated chemical reaction between a target material (metal, semiconductor, alloy) and a reactive gas such as oxygen or nitrogen which is mixed with an inert gas such as argon and introduced into a vacuum chamber equipped with a plasma source such as a magnetron.

Reactive sputtering methods are widely used in numerous electronic and surface engineering applications to produce thin dielectric films having certain functional characteristics. Silicon dioxide, for example, can be deposited using the reactive sputtering technique by introducing a mixture of argon and oxygen to a sputtering system equipped with a silicon sputter target. The oxygen in the mixture reacts with the sputtered silicon to form silicon dioxide. Similar reactions can occur using aluminum to form aluminum oxide, for example, or other materials which can react with oxygen to create a deposited film that incorporates oxygen with another element or combination of elements from the sputter target. The sputter target need not be made of a single element.

Alternatively, nitrogen can be mixed with an inert gas such as argon and introduced into the sputtering system to produce a reaction between the nitrogen and the sputtered target material to create a deposited film that incorporates nitrogen with another element or combination of elements from the sputter target. When aluminum is sputtered in the presence of nitrogen, for example, a deposited aluminum nitride layer can be formed on the substrate.

Two main approaches to power delivery for reactive sputtering are commonly employed: 1) pulsed dc, which is usually applicable for single target magnetron powering and 2) mid-frequency or alternating current (ac) powering, which is most effective for dual or other split cathode magnetron arrangements. Typical ac frequencies used in ac powered, split cathode configurations are in the range of 20-200 kHz.

The origin and evolution of intrinsic stress in thin films or structures of thin films can be viewed, for example, in terms of the processes responsible for the formation of the film microstructure. The type of stress, either compressive or tensile, and the magnitude of the stress have been shown to vary with the magnitude of the flux and energy of particles impinging on the growing film as reported by Windischmann, for example. The majority of magnetron sputtered metal films have a relatively low-density structure corresponding to zones 1 or T of the Structure Zone Model, as reported by Thornton, in which microvoids lead to the generation of tensile stress. Compressive stress is generated by an "atomic peening" mechanism whereby ions or accelerated neutrals from the plasma bombard the growing film creating interstitial atoms in the deposited film. Reactively sputtered oxide and nitride films often exhibit a tendency toward compressive stress due to a high concentration of reactive (for example, nitrogen or oxygen) gas atoms entrapped into the interstitial positions in the crystal lattice of the growing films.

The most effective methods for reducing the tensile stress in growing films are to employ ion assisted deposition and sputtering with substrate bias which enhances the ion bombardment of the film during deposition as reported by Chiu, et al. Ion bombardment during deposition results in argon entrapment and atomic peening, which promotes the displacement of surface atoms towards deeper positions in the bulk of the growing films leading to the filling of voids and atomic level vacancies and the formation of crystalline defects such as interstitial atoms.

In contrast, compressive stress can be reduced by restricting the generation of interstitial atoms by reducing the flux, by reducing the energy, or by reducing both the flux and the energy of energetic species arriving from the magnetron plasma discharge to the surface of the growing film. Compressive stress in the growing films can also be reduced by depositing the films at elevated temperature (higher adatom mobility allows interstitial atoms to be incorporated in the lattice) and by increasing the pressure of the sputter gas during the deposition of the films (sputtered atoms and ions experience more collisions with Ar atoms thus losing their energy before reaching the substrate).

In general, published results from investigations of stress in aluminum nitride films are consistent with known models. Este and Westwood reported that intrinsic stress in the films deposited from a planar aluminum target using rf discharge in argon/nitrogen mixtures changed drastically with increasing gas pressure from compressive −19 GPa to tensile +2.5 GPa. (In this context, a negative or minus stress is compressive and a positive or plus stress is tensile.) It was suggested that high compressive stress is due to bombardment of the film by energetic neutral nitrogen atoms reflected from the target, which is reduced as pressure is increased. Iriarte et al. completed a systematic study of the influence of the main process parameters on residual stress in fully textured polycrystalline aluminum nitride films deposited by a reactive pulsed dc magnetron. They revealed the effects of sputter gas pressure on stress through atom-assisted and atomic peening mechanisms. Dubois and Muralt showed that residual stress in aluminum nitride films deposited on a Pt electrode by reactive pulsed dc magnetron depended essentially on ion bombardment and on the sputtering pressure. Martin at al. found that aluminum nitride films deposited on Mo and Pt electrodes using pulsed dc sputter technology had inherent tensile stress, which might be reduced by depositing the aluminum nitride with a negative substrate bias.

There is sparse information in the literature related to the stress behavior of ac reactively sputtered highly textured aluminum nitride films. It was reported by Oshmyansky et al. that residual stress in the aluminum nitride films reactively deposited utilizing an ac powered magnetron with a dual-ring target configuration might be controlled partly by manipulating gas pressure and partly by manipulating magnetic field. Stress was changed from tensile +300 MPa to high compressive −1.3 GPa when the magnetic field strength was increased from 220 to 600 Gauss. It is necessary to point out that implementing aluminum nitride film stress control by manipulating the magnetic field influences the erosion profile of the sputtering target and, also, that it is a technically inconvenient method for industrial sputtering equipment. Adjustment of the pressure is also inconvenient since pressure can greatly affect other important characteristics of the sputter deposited films.

In view of the above, new methods are required to provide independent stress control in the formation of thin films, and in particular for thin films used in electro-acoustic device applications. It is the object of the present invention to provide a sputtering tool that enables control of the stress of sputter deposited films.

SUMMARY

Reactive sputtering methods are widely used in numerous electronic and surface engineering applications to produce thin dielectric films having certain characteristics such as the film thickness uniformity, crystallographic orientation, stress, and other film properties. Independent control of these characteristics is important for the deposition of piezoelectric aluminum nitride films with specific crystal orientation used in resonator-based applications such as BAW and FBAR filters, oscillators, and resonating sensors. Low intrinsic stress is required for the thin film stacks employed in electro-acoustic devices.

In the present invention, a stress adjustment mechanism is used in a mid-frequency (20-200 kHz) powered sputtering configuration that utilizes a split cathode sputter target assembly consisting of at least two sputter targets and an electrode. A typical two-piece sputter assembly, presented here for example, is the S-Gun configuration manufactured by Tegal Corporation. The stress adjustment mechanism is used to control the stress in the growing film by providing a means to control the flux of charged species from the plasma to the substrate upon which the film or films are grown, by providing a means of controlling the distribution of discharge current between the sputter targets and the internal shields of the magnetron. Stress is controlled in deposited films in the present invention by providing a stress adjustment mechanism for adjusting the impedance between the inner target, for example, in the split cathode S-gun manufactured by Tegal Corporation, and shield located within the process chamber.

Film stress in sputter deposited films can be controlled independently of other process parameters such as pressure, power, and gas mixture by varying the impedance of the stress adjustment unit. The variation in film stress is believed to result from a suppression of the flux of charged particles to the substrate. The applicability of the invention is not restricted to the validity of this proposed explanation for the observed change in stress in the film but rather is presented here as a possible explanation for the apparent improvement in performance for split cathode sputtering systems which are equipped with the stress adjustment unit described herein.

In one embodiment of the present invention, the stress adjustment unit can be electrically connected to at least one of the sputter targets in a split cathode sputter system having a power supply with an alternating voltage with frequency of 20-200 kHz, and preferably 40 kHz, connected between a pair of targets having a coaxial relationship. With a sputtering tool configured with the stress adjustment unit, the stress in the deposited film can be varied by varying the resistive component of the impedance in the stress adjustment unit. In one embodiment of the current invention, the stress in the deposited film was found to vary from +100 MPa tensile to −300 MPa compressive by varying the resistance in the stress adjustment unit from 5 to 60 Ohms.

DETAILED DESCRIPTION OF THE PREFERRED EMBODIMENTS

Effective stress control can be attained using the present invention for a wide range of films deposited with split cathode sputtering configurations. The description provided herein is intended, by example, to illustrate the key attributes of the present invention using the S-Gun dual cathode configuration manufactured by Tegal Corporation. The use of this split cathode sputtering configuration is not intended in any way to limit the scope of the present invention which can be implemented in other sputtering tool configurations that utilize multiple sputtering targets. Additionally, the scope of the invention is not intended to be limited to the aluminum nitride films discussed in the preferred embodiment. The invention is applicable to all films that can be deposited using reactive sputtering in a split or multi-cathode configuration.

Figure 1:
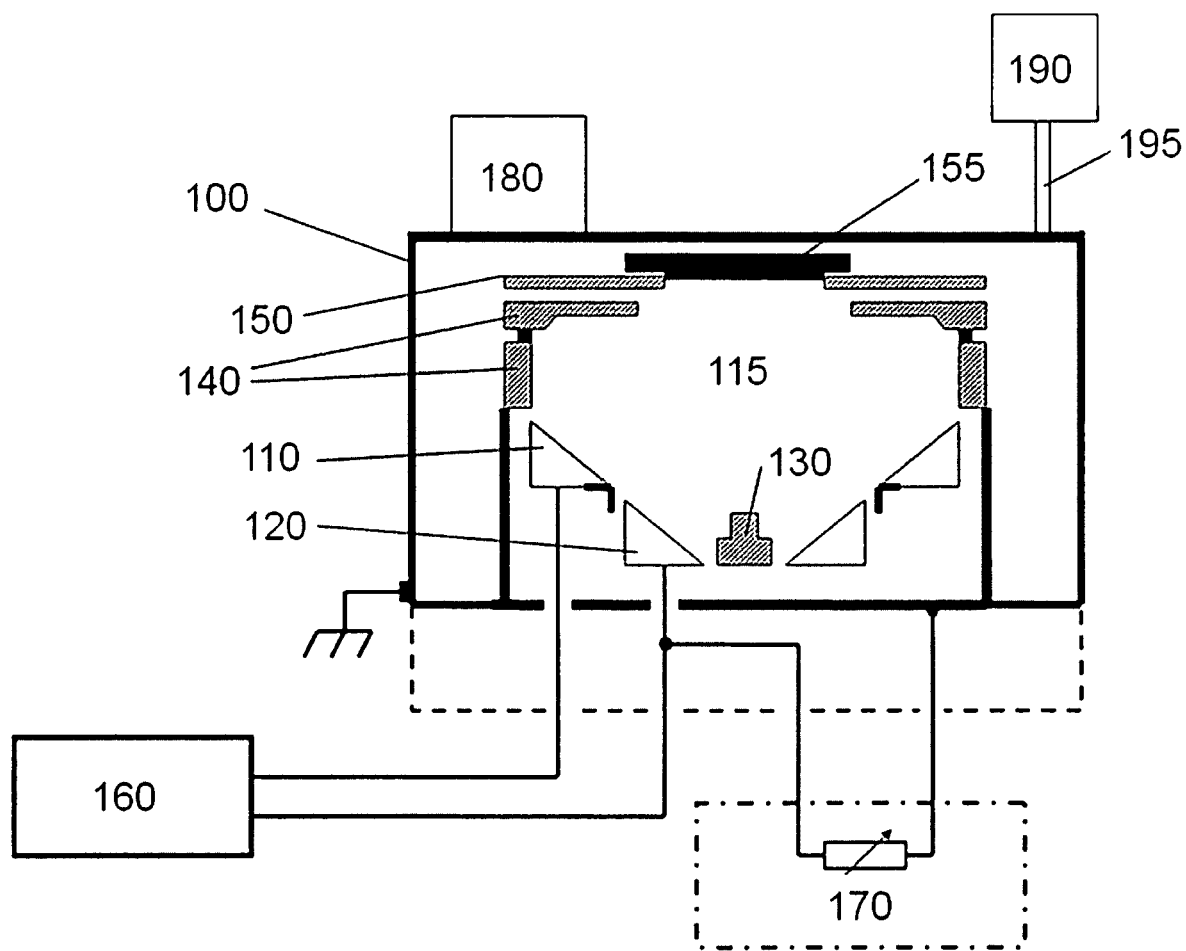
FIG. 1 shows a schematic diagram of the process module with an S-Gun magnetron manufactured by Tegal Corporation.

In the schematic illustration provided in FIG. 1, a number of key attributes of the preferred embodiment are shown. The preferred embodiment consists of a process chamber 100 within which is contained a cavity 115. Two conical sputter targets, an outer sputter target 110 and an inner sputter target 120, are mounted concentrically around a center shield 130. Additional shields 140 in the preferred embodiment are shown at the top and periphery of the process chamber 100. A wafer land 150 is shown supporting substrate 155 at the top of the process chamber in this preferred embodiment in which the side of the substrate upon which the sputtered layer is deposited faces downward into the cavity 115 containing sputter targets 110 and 120.

In the preferred embodiment, an ac power supply 160 with an output signal that is bipolar is electrically connected between the outer sputter target 110 and the inner sputter target 120. In this context, bipolar is defined as a signal that has a positive voltage for part of the repeating periodic cycle and negative for part of the cycle. A stress adjustment unit 170 containing a variable resistor or means for varying the resistance or resistive component of the impedance is electrically connected between the inner target 120 and a shield 140 mounted within the process chamber that can be grounded.

In the preferred embodiment, the process chamber has an attached vacuum pumping system 180 that typically consists of a turbomolecular pump and a backing pump such as a diaphragm pump. Additionally, a gas source 190 is connected through a gas delivery system to provide the process gases required for operation of the sputter system. Typical operating pressures for the sputter system in the preferred configuration are between 0.1 mTorr and 10 mTorr.

In the preferred embodiment, the split cathode sputtering tool is evacuated to a base pressure of less than the operating pressure, and preferably less than $1\times10^{-6}$ Torr using vacuum pumping system 180. In the case in which the preferred embodiment is used to reactively sputter deposit a film, argon gas mixed with a reactive gas such as oxygen or nitrogen, is provided from gas source 190 and delivered to process chamber 100 through gas delivery system 195. A plasma discharge is generated by applying power from power supply 160 at between 20-200 kHz, and preferably 40 kHz, between the sputter targets 110 and 120. Magnetic fields are present in the vicinity of sputter targets 110 and 120 to enhance ionization of the process gas. Stress control is achieved in the sputtered films deposited on the substrate 155 by varying the resistance in stress adjustment unit 170.

For example only, a description of the configuration for achieving effective stress control is provided for polycrystalline piezoelectric aluminum nitride films deposited with ac reactive sputtering processes using a dual cathode magnetron configured with a stress adjustment unit 170 consisting of a variable resistor. In the preferred embodiment, the split cathode magnetron is a dual cathode magnetron referred to as the S-Gun, a plasma vapor deposition system manufactured by Tegal Corporation.

In a preferred embodiment in which aluminum nitride film is being deposited, the gas source 190 is a mixture of argon and nitrogen. In this example of the preferred embodiment, the sputter targets 110 and 120 are made of aluminum. Targets of alternative materials that are clad in aluminum could also be used and be within the spirit of the present invention.

During operation of the present invention, the 20-200 kHz ac power supply 160 with a floating output is connected directly between the outer target 110 and the inner target 120. With the split cathode sputtering tool operating in this configuration, the two targets act, alternatively, as both the anode and the cathode of the magnetron discharge, and therefore a dedicated anode is not needed to support a stable discharge However, internal shields 140 and 130, or other shields suitably placed within the process chamber 100 may also serve as passive anodes for better control and stability of the plasma discharge.

Figure 2:
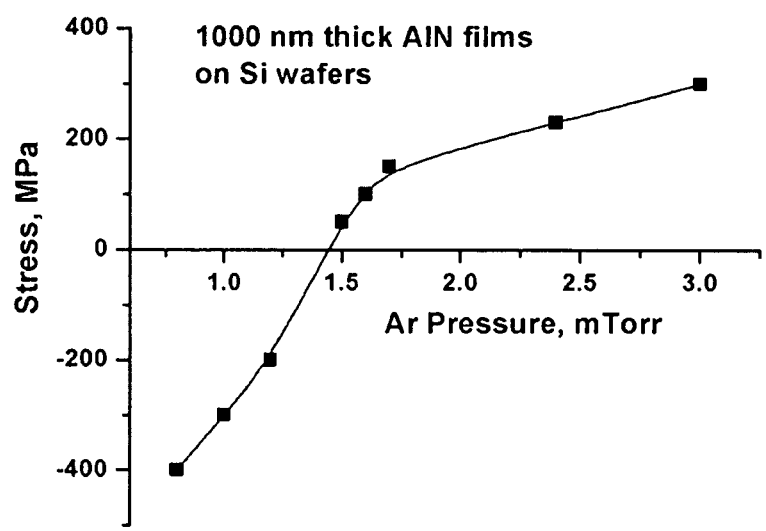
FIG. 2 shows the stress in reactively sputtered 1000 nm thick aluminum nitride films for a range of argon gas pressure in the S-Gun during sputter deposition.

FIG. 2 shows a plot of the residual stress in aluminum nitride films deposited by the S-Gun by varying the argon gas pressure. This figure is provided for the purpose of demonstrating how stress can be varied in thin films using conventional methods of varying a dependent process conditions such as pressure that will typically influence other aspects of the deposited thin film characteristics in addition to the stress. FIG. 2 shows that compressive stress is reduced, and may be converted to tensile stress, by increasing the argon pressure in the S-Gun from 1 mTorr to 5 mTorr. A disadvantage of using pressure to control stress in the growing films results from the dependence of other film characteristics on the pressure. For example, the aluminum nitride deposition rate and the uniformity of the aluminum nitride film can vary significantly and undesirably with pressure. A more preferable method, as provided by the present invention, is to enable adjustments to the stress in the film with minimal or no effect on other pertinent properties of the films.

The present invention provides a mechanism for controlling stress in aluminum nitride, and other, sputter deposited films independently of other factors such as deposition rate, film uniformity, and crystallographic orientation. In the preferred embodiment, the compressive stress in the aluminum nitride films is controlled by controllably suppressing the flux of charged particles to the substrate by redistributing the discharge current between the targets and the internal shields of the magnetron. For this purpose, the S-Gun for ac reactive sputtering is equipped with Stress Adjustment Unit 170.

Figure 3A:
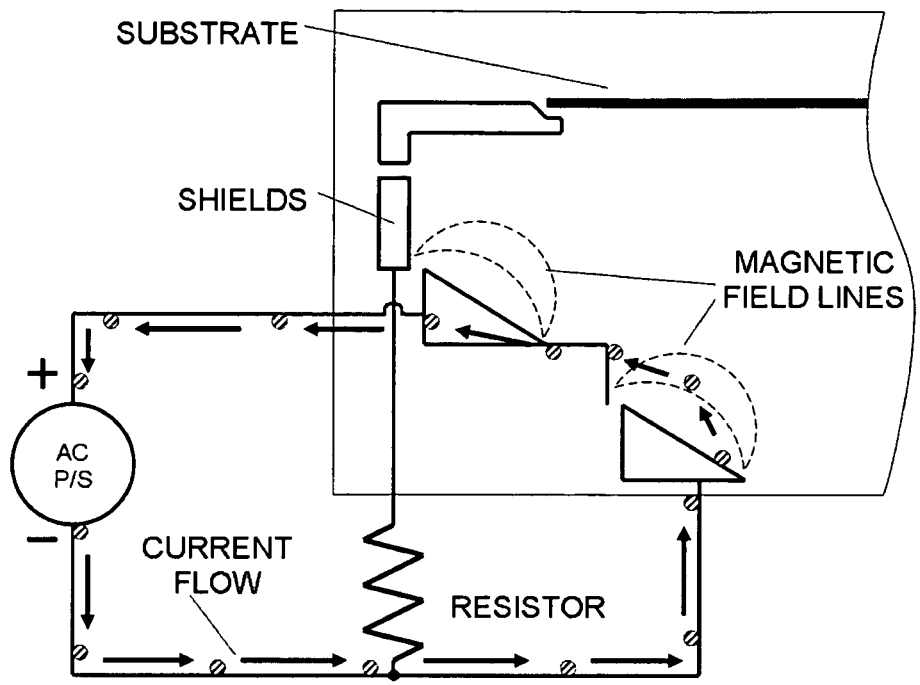
FIG. 3a shows the path of the electron current through the ac powered S-Gun magnetron during the half of the applied ac signal for which the voltage on the outer sputter target is positive relative to the inner target.
Figure 3B:
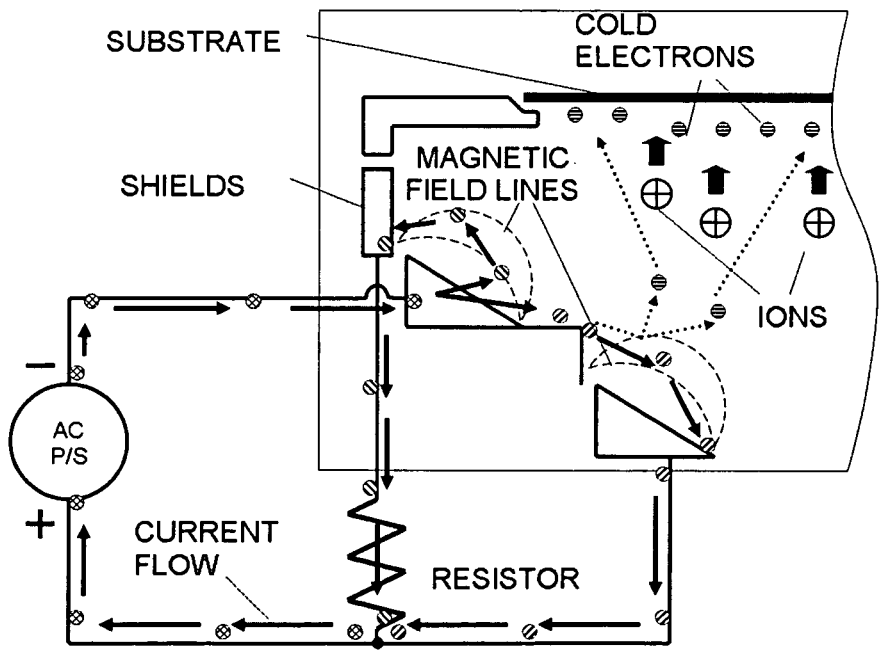
FIG. 3b shows the path of the electron current through the ac powered S-Gun magnetron during the half of the applied ac signal for which the voltage on the outer sputter target is negative relative to the inner target.

The main principles of operation of stress adjustment unit 170 can be understood by considering simplified diagrams of the electrical current distribution in the S-Gun as shown in FIGS. 3a and 3b. During one half of the cycle of the bipolar ac signal from power supply 160, the output voltage on the outer target 110 will be positive relative to the output voltage on the inner target 120. During this part of the ac cycle, electrons will flow from the inner target 120 to the outer target 110 in the plasma discharge and will not experience significant resistance. Current flow through the circuit during this half of the ac signal is shown in the diagram in FIG. 3a.

Conversely, during the half of the cycle of the ac signal from power supply 160 in which the output voltage on the outer target 110 is negative relative to the output voltage applied to the inner target 120, electrons from the outer target must flow across the magnetic field of the inner target and hence experience magnetic repulsion as shown in the circuit diagram in FIG. 3b. It is during this part of the ac cycle that the stress control unit 170 acts to adjust the current flow between the outer target 110 and the inner target 120. In essence, the stress control unit 170 provides a shunt path that directs current flow from the positively biased inner sputter target 110 to the shields 140.

This shunt path removes low-energy electrons that may leave the plasma column of the magnetron discharge and diffuse to the substrate vicinity encouraging a corresponding flux of positive ions to reach the substrate which in turn intensifies ion bombardment of the growing film on the substrate, and thus leads to the formation of an increase in compressive stress in the growing film by the atomic peening mechanism.

The precise explanation of the cause or causes of the apparent benefit observed from the use of the present invention is subject to interpretation and the presentation of these theories to explain the benefits of the invention, in terms of its application as a means for implementing stress control is not intended in any way to detract from the validity of the invention.

The ac power supply 160 is connected between the outer sputter target 110 and inner sputter target 120, which act alternatively as anode and cathode, and as a result, the internal shields 130 and 140 of the S-Gun are not incorporated into the electrical circuit of the discharge current in a configuration without the stress control unit 170. However, by introducing an electrical connection between the inner target 120 and shields 140, a path for current flow is provided for discharge currents to flow from the outer target 110 to the shields 140. By shorting the inner target to the shield, a preferred path is created for discharge currents from the outer target to the shield 140.

Alternatively, a stress adjustment unit 170 with a variable resistor is believed to provide tunability of the electron flux density to the substrate by means of controllable suppression of the flux of charged particles to the substrate by redistributing the discharge current between the targets and the internal shields of the S-Gun.

Figure 4:
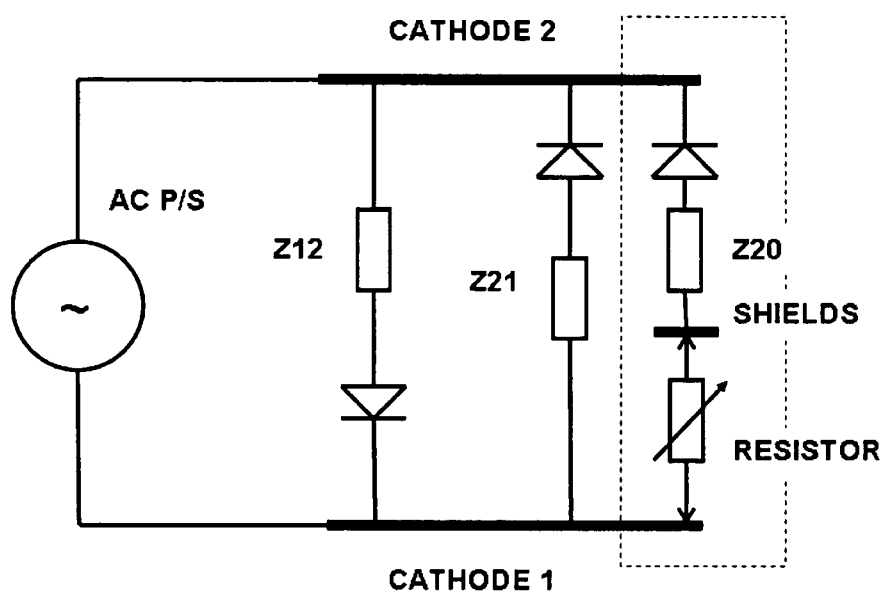
FIG. 4 shows an equivalent electrical circuit diagram of the S-Gun magnetron for reactive sputtering.

In the diagram in FIG. 4, the operation of the stress adjustment unit 170 is depicted by a simplified equivalent electrical diagram of the S-Gun magnetron. The diagram shown in FIG. 4 shows the impedances of the plasma as Z12 for discharge current flowing from the inner target 120 (cathode 1) to the outer target 110 (cathode 2), Z21 for discharge current flowing from outer target 110 (cathode 2) to inner target 120 (cathode 1), and Z20 for discharge current flowing from inner target 120 (cathode 2) to the internal shields 140.

The configuration of the magnetic field in the vicinity of the outer sputter target 110 and the inner sputter target 120, and the geometrical configuration of the internal shields 140 in the S-Gun cause low values of Z12 and Z20 (discharge currents follow force lines of the magnetic field) while the value of Z21 is much higher due to resistance created by the configuration of the magnetic field in the vicinity of the inner target 120 (cathode 1).

In an ac-powered S-Gun operating either without a stress adjustment unit 170 or with the stress adjustment unit set to a high resistance value greater than 100 ohms, the internal shields are not incorporated into the electrical circuit of the discharge current and current flows are distributed only through the circuit branches Z12 and Z21. Because of the high impedance of circuit Z21, the amount of cold electrons in the positive column of the magnetron discharge is maximized. Diffusion of these relatively low-energy electrons from the plasma column to the substrate vicinity encourages a corresponding flux of positive ions to reach the substrate from the plasma. As a result, the growing film is exposed to intensive ion bombardment from the corresponding plasma under these conditions resulting in the formation of high compressive stress in the aluminum nitride films deposited under these conditions.

Conversely, in an ac-powered S-Gun configuration with stress adjustment unit 170 that includes the low impedance circuit Z20, a preferable path for the discharge current from the outer sputter target 110 (Cathode 2) to the shields 140 is introduced to the circuit by connecting the inner target 120 (cathode 1) to the shields 140. In this case, the shields 140 receive the electrical potential of sputter target 120 (cathode 1).

In the preferred embodiment with the stress adjustment unit 170, the ion bombardment of the growing film on the substrate is reduced, which correspondingly reduces the compressive stress in the growing film or changes the characteristic stress in the film from compressive to tensile. By inserting a permanent or variable resistor into the Z20 circuit, the flux of charged particles, or current flow, to the substrate can be controlled to the extent that desirable film properties that include stress are achieved. Since circuit branches Z21 and Z20 are connected in parallel, the value of the inserted resistor has significant influence on the current redistribution between these branches. In this case, the lower the value of the resistance for the resistor in the stress adjustment unit 170 shown in FIG. 4, the lower the discharge current through circuit Z21. Thus, compressive stress can be reduced and controlled simply by adjusting the value of the variable resistor.

Figure 5:
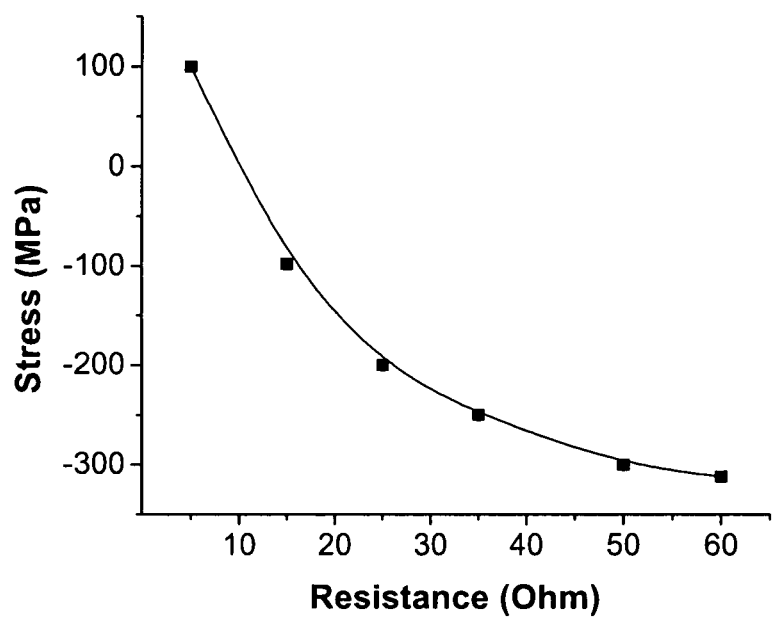
FIG. 5 shows the stress in 1000 nm thick aluminum nitride films for a range of resistor values for the variable resistor in the Stress Adjustment Unit.

Experimental data have been collected to show the high efficiency of the stress adjustment unit 170 for controlling stress in aluminum nitride films. In FIG. 5, the measured stresses are shown for a number of 1000 nm thick aluminum nitride films deposited using similar process conditions with the exception of the resistance in value in the stress control unit 170. The stress in the deposited aluminum nitride films was found to change gradually from compressive −320 MPa to tensile +110 MPa when resistor values in the stress adjustment unit 170 were reduced from 60 ohms to 5 ohms.

Figure 6:
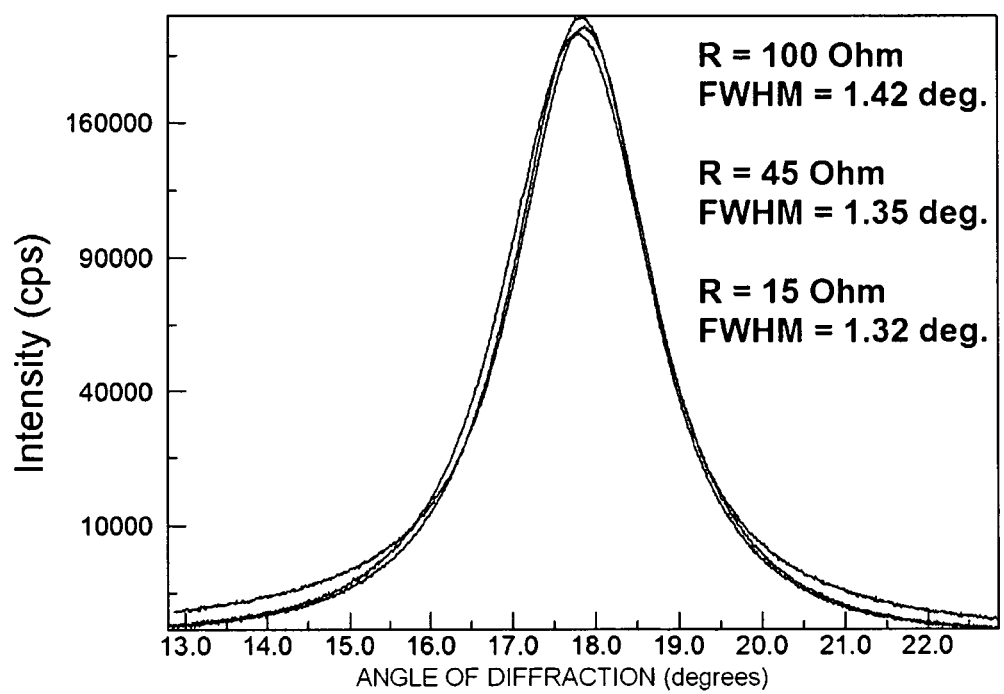
FIG. 6 shows the crystal orientation of 1000 nm thick aluminum nitride films deposited on well-textured molybdenum electrodes for various resistor values in the Stress Adjustment Unit.

The crystalline orientation of the deposited aluminum nitride, a parameter of primary importance for many applications in which aluminum nitride thin films are used, was not affected by the variation in resistor values in the stress adjustment unit 170. FIG. 6 shows x-ray diffraction rocking curve measurements from a number of aluminum nitride films deposited on Mo electrodes on Si substrates. The x-ray diffraction angle measurements show that the full width at half maximum (FWHM) traces obtained from 1000 nm thick aluminum nitride films, corresponding to crystalline orientations in the aluminum nitride that range from 1.32-1.42° for resistor values in the stress adjustment unit 170 that ranged from 15 ohms to 100 ohms. In view of the wide range of control observed in the stress measurements of the aluminum nitride films, in combination with the relatively small changes in the crystalline orientation over the wide range of resistor values that were examined in the stress adjustment unit 170, the present invention provides independent stress control in the formation of thin films and demonstrates the apparent benefit of the present invention.

The example provided in the preferred embodiment, in which the stress control unit contains a variable resistor, is intended as an example. Other circuit elements can be incorporated into the stress adjustment unit 170 to produce similar results. For example, the invention may be implemented by incorporating a dc power supply into the stress adjustment unit 170 in place of, or in combination with the variable resistor. For a configuration in which a dc power supply is incorporated into the stress adjustment unit 170, the main principles of stress control are similar to those described above pertaining to resistor regulation in which current flows are effectively redistributed between the sputter targets 110 and 120 and the shields 140.

Additionally, the use of a variable resistor is provided for demonstrating the variation in film stress that is achievable using the inventive configuration. It is understood that a resistor with a fixed value can be used in place of the variable resistor in stress control unit 170 upon the determination of the optimal resistance value for a desired application. Alternatively, a plurality of fixed value resistors can be used to provide discrete resistance values that cover the range of resistance described and remain within the spirit of this invention. Other circuit elements and combinations of circuit elements can also be introduced into stress adjustment unit 170 to produce the results taught by the present invention.

Automated control circuitry for the stress adjustment unit 170 is assumed to be within the scope of the present invention. Control circuitry can be used to select the resistance value for a variable resistor, to select one or more of a plurality of fixed resistors to provide a target resistance value in the range of 3 ohms to 100 ohms, to select between any number of circuit elements that are incorporated into stress adjustment unit 170 to provide the targeted resistance values needed to produce a desired level of stress in sputter deposited films.

In general, the optimization of the reactive sputtering process in a split magnetron configuration such as the S-Gun is performed to optimize the film thickness and uniformity prior to introducing the stress adjustment. For cases in which a sputter process is optimized for film thickness, uniformity, or another desirable film property, or combination of film properties, compressively stressed films are usually deposited when the stress adjustment unit 170 is set to a high resistance value or to an open circuit condition. A desirable stress value in the film can be achieved by switching the resistance of the variable resistor in the stress adjustment unit 170 from a high value to a lower value.

REFERENCES

H. Windischmann, J. Vac. Sci. Technol. A9, 2431 (1991).
J. A. Thornton, J. Vac. Sci. Technol. A4, 3059 (1986).
H. Windischmann, Crit. Rev. Solid State Mater. Sci. 17, 547 (1992).
K. F. Chiu, Z. H. Barber, and R. E. Somekh, Thin Solid Films, 39-42, 343 (1999).
G. Este and W. D. Westwood, J. Vac. Sci. Technol. A5, 1892 (1987).
G. Iriarte, F. Engelmark, M. Ottosson, and I. Katardjiev, J. Mater. Res. 18, 423 (2003).
Y. Oshmyansky, J. Larson, R. Ruby, and S. Mishin, Semicond. Int., March 2003.

What is claimed is:

1. A stress adjustment unit comprising—
a stress adjustment circuit having a first terminal connected to a first internal shield of a plurality of internal shields of a sputter chamber and a second terminal connected to a first sputter target of a plurality of sputter targets in a sputter chamber for sputtering a film, the plurality of sputter targets including at least the first sputter target and a second sputter target, the second sputter target being interposed between the first sputter target and the first internal shield, the first internal shield being proximate the second sputter target, wherein the stress adjustment circuit comprises at least one variable resistor for adjusting an intrinsic stress of the sputtered film.

2. A stress adjustment unit as in claim 1 wherein the stress adjustment circuit provides a path for a current flow between the first internal shield and the first sputter target.

3. A stress adjustment unit as in claim 1 wherein the stress adjustment circuit lowers an impedance between the first internal shield and the the inner target.

4. A stress adjustment unit as in claim 1 wherein a redistribution of the current flow between the first sputter target, the second sputter target and the first internal shield varies based on a resistance value of the variable resistor between the first internal shield and the first sputter target.

5. A stress adjustment unit as in claim 1 wherein the stress adjustment circuit further comprises a dc power supply.

6. A sputtering system comprising:
a sputter chamber supporting a substrate, the sputter chamber having a first internal shield of a plurality of internal shields, at least two sputter targets in the sputter chamber for sputtering a film onto the substrate, including an inner sputter target and an outer sputter target, the outer sputter target being interposed between the inner sputter target and the first internal shield, the first internal shield being proximate the outer sputter target;
an ac power supply having a first electrode and a second electrode, the first electrode connected to the inner sputter target and the second electrode connected to the outer sputter target;
a stress adjustment unit comprising a stress adjustment circuit having a first terminal connected to the first internal shield, and a second terminal connected to the inner sputter target,
wherein the stress adjustment circuit comprises at least one variable resistor for adjusting an intrinsic stress of the sputtered film.

7. A sputtering system as in claim 6 wherein the stress adjustment circuit provides a path for a current flow between the first internal shield and the inner sputter target.

8. A sputtering system as in claim 6 wherein the stress adjustment circuit lowers an impedance between the first internal shield and the inner sputter target.

9. A sputtering system as in claim 6 wherein the sputtering system further comprises a controller for controlling the value of the variable resistor.

10. A sputtering system as in claim 6 wherein the stress adjustment circuit comprises a dc power supply.

11. A stress adjustment unit as in claim 1 wherein the resistor value of the at least one variable resistor is less than 100 Q and greater than 3 Q.

12. A stress adjustment unit as in claim 1 wherein the sputter chamber further comprises a controller for controlling the value of the variable resistor.

13. A sputtering system as in claim 6 wherein the ac power supply has a frequency between 20 and 200 kHz.

14. A sputtering system as in claim 6 wherein the target is an Al target.

* * * * *